(12) United States Patent
Chan

(10) Patent No.: US 10,911,036 B1
(45) Date of Patent: Feb. 2, 2021

(54) ACCELERATING DISCHARGE DEVICE

(71) Applicant: Acer Incorporated, New Taipei (TW)

(72) Inventor: Tzu-Tseng Chan, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 0 days.

(21) Appl. No.: 16/988,032

(22) Filed: Aug. 7, 2020

(30) Foreign Application Priority Data

Mar. 17, 2020 (TW) .............................. 109108734 A

(51) Int. Cl.
*H03K 5/1252* (2006.01)
(52) U.S. Cl.
CPC ................... *H03K 5/1252* (2013.01)
(58) Field of Classification Search
None
See application file for complete search history.

(56) References Cited

U.S. PATENT DOCUMENTS

| 6,084,790 A * | 7/2000 | Wong | H02M 3/1584 323/272 |
| 9,042,132 B2 * | 5/2015 | Richards | H02M 1/44 363/39 |
| 9,093,917 B2 * | 7/2015 | Ho | H02M 1/4225 |
| 10,616,971 B1 * | 4/2020 | Ajo | H02M 3/33576 |
| 2004/0062362 A1 * | 4/2004 | Matsuya | H04B 10/1141 379/56.1 |
| 2007/0241838 A1 * | 10/2007 | Suzuki | H03H 7/1758 333/181 |
| 2014/0340940 A1 * | 11/2014 | Ouyang | H01F 27/28 363/17 |
| 2015/0070102 A1 * | 3/2015 | Dai | H05K 1/0245 333/12 |
| 2015/0349739 A1 * | 12/2015 | Wu | H03H 7/1758 333/170 |

* cited by examiner

*Primary Examiner* — Cassandra F Cox
(74) *Attorney, Agent, or Firm* — McClure, Qualey & Rodack, LLP

(57) ABSTRACT

An accelerating discharge device includes a first parallel inductive element, a second parallel inductive element, a first capacitor, a noise suppression element, a one-way element, a first discharge circuit, a second discharge circuit, a first switch element, and a second switch element. The first parallel inductive element generates a first control voltage according to a first input voltage. The second parallel inductive element generates a second control voltage according to a second input voltage. The first switch element selectively couples the first parallel inductive element through the second discharge circuit to a ground according to the first control voltage. The second switch element selectively couples the second parallel inductive element through the second discharge circuit to the ground according to the second control voltage.

15 Claims, 4 Drawing Sheets

ACCELERATING DISCHARGE DEVICE

CROSS REFERENCE TO RELATED APPLICATIONS

This Application claims priority of Taiwan Patent Application No. 109108734 filed on Mar. 17, 2020, the entirety of which is incorporated by reference herein.

BACKGROUND OF THE INVENTION

Field of the Invention

The disclosure generally relates to an accelerating discharge device, and more specifically, to an accelerating discharge device meeting the requirements of IEC (International Electrotechnical Commission).

Description of the Related Art

IEC (International Electrotechnical Commission) has set a second edition of the new safety standard IEC 62368-1, which will take effect on Dec. 20, 2020 and replace the current IEC 60950 standard.

According to the requirements of the second edition of IEC 62368-1, if the external input power of a device is removed under normal conditions, an input voltage of the device should be discharged to 60V within 2 seconds. Conversely, if the external input power of the device is removed under abnormal conditions, the input voltage of the device should be discharged to 120V within 2 seconds. However, a conventional power supply device usually cannot meet the above requirement. Accordingly, there is a need to propose a novel solution for solving the problems of the prior art.

BRIEF SUMMARY OF THE INVENTION

In an exemplary embodiment, the invention is directed to an accelerating discharge device that includes a first parallel inductive element, a second parallel inductive element, a first capacitor, a noise suppression element, a one-way element, a first discharge circuit, a second discharge circuit, a first switch element, and a second switch element. The first parallel inductive element generates a first control voltage according to a first input voltage. The second parallel inductive element generates a second control voltage according to a second input voltage. The first capacitor is coupled between the first parallel inductive element and the second parallel inductive element. The noise suppression element is configured to reduce the interference between the first parallel inductive element and the second parallel inductive element. The one-way element is configured to limit the first control voltage and the second control voltage in a single transmission direction. The first discharge circuit is coupled between the first parallel inductive element and the second parallel inductive element. The first switch element selectively couples the first parallel inductive element through the second discharge circuit to a ground according to the first control voltage. The second switch element selectively couples the second parallel inductive element through the second discharge circuit to the ground according to the second control voltage.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are described in detail as follows:

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Moreover, the term "couple" is intended to mean either an indirect or direct electrical connection. Accordingly, if one device is coupled to another device, that connection may be through a direct electrical connection, or through an indirect electrical connection via other devices and connections.

Figure 1:
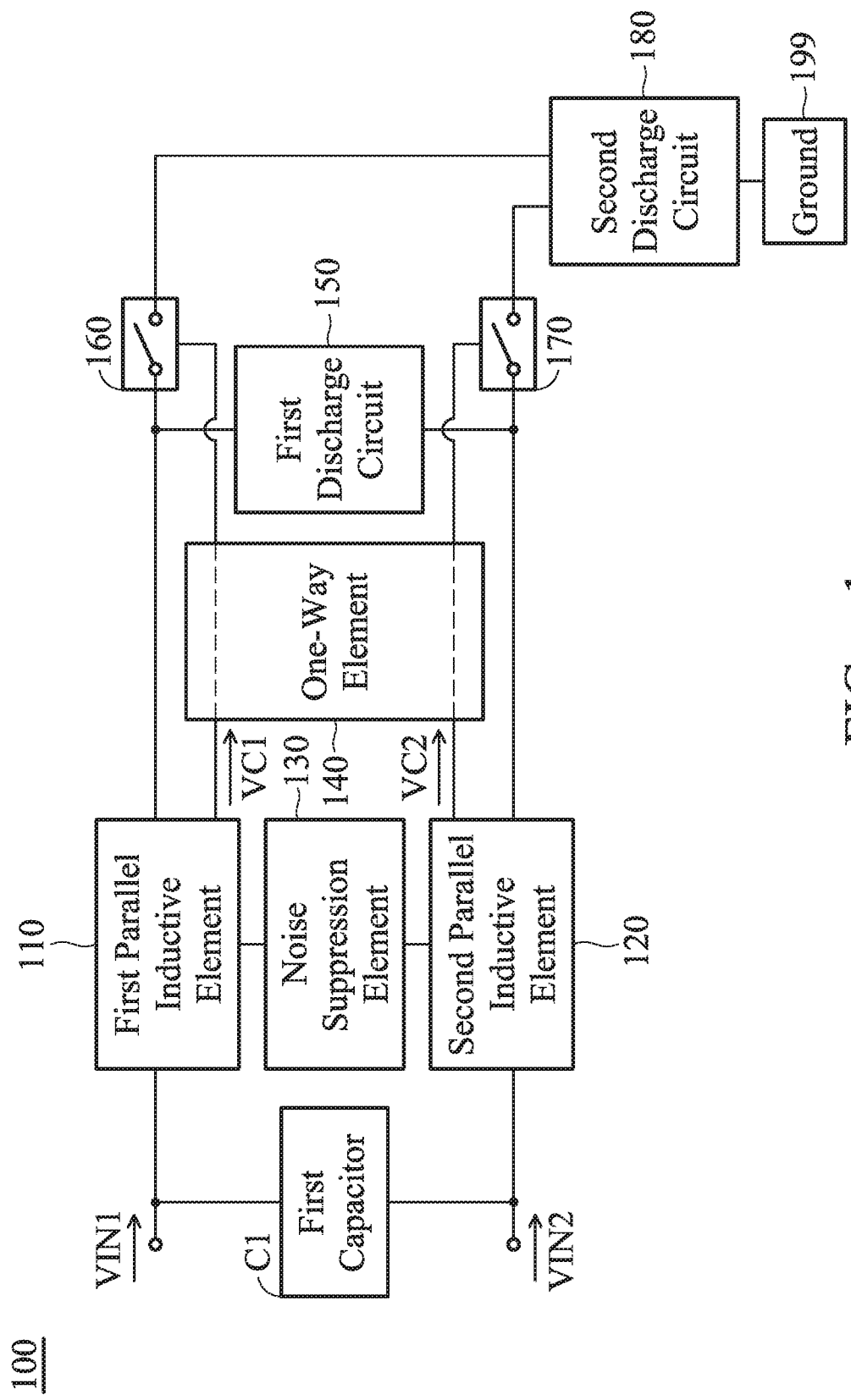
FIG. 1 is a diagram of an accelerating discharge device according to an embodiment of the invention.

FIG. 1 is a diagram of an accelerating discharge device 100 according to an embodiment of the invention. For example, the accelerating discharge device 100 may be applied to a power supply device, but it is not limited thereto. As shown in FIG. 1, the accelerating discharge device 100 includes a first capacitor C1, a first parallel inductive element 110, a second parallel inductive element 120, a noise suppression element 130, a one-way element 140, a first discharge circuit 150, a first switch element 160, a second switch element 170, and a second discharge circuit 180. It should be noted that the accelerating discharge device 100 may further include other components, such as a voltage regulator and/or a negative feedback circuit, although they are not displayed in FIG. 1.

The first parallel inductive element 110 generates a first control voltage VC1 according to a first input voltage VIN1. The second parallel inductive element 120 generates a second control voltage VC2 according to a second input voltage VIN2. The first input voltage VIN1 and the second input voltage VIN2 may be from an external input power source. An AC (Alternating Current) voltage difference with any frequency and any magnitude may be formed between the first input voltage VIN1 and the second input voltage VIN2. For example, the frequency of the AC voltage difference may be about 50 Hz or 60 Hz, and the RMS (Root-Mean-Square) value of the AC voltage difference may be from 90V to 264V, but it is not limited thereto. The first capacitor C1 is coupled between the first parallel inductive element 110 and the second parallel inductive element 120. The noise suppression element 130 is configured to reduce the interference between the first parallel inductive element 110 and the second parallel inductive element 120. The one-way element 140 is configured to limit the first control voltage VC1 and the second control voltage VC2 in a single transmission direction. The first discharge circuit 150 is coupled between the first parallel inductive element 110 and the second parallel inductive element 120. The first switch element 160 selectively couples the first parallel inductive element 110 through the second discharge circuit 180 to a ground 199 according to the first control voltage VC1. The ground 199 may mean the earth or any grounding path coupled to the earth, and it is not an internal element of the accelerating discharge device 100. For example, if the first control voltage VC1 has a high logic level (i.e., a logic "1"), the first switch element 160 may couple the first parallel inductive element 110 through the second discharge circuit 180 to the ground 199 (i.e., the first switch element 160 is similar to a short-circuited path). Conversely, if the first control voltage VC1 has a low logic level (i.e., a logic "0"), the first switch element 160 may not couple the first parallel inductive element 110 through the second discharge circuit 180 to the ground 199 (i.e., the first switch element 160 is similar to an open-circuited path). The second switch element 170 selectively couples the second parallel inductive element 120 through the second discharge circuit 180 to the ground 199 according to the second control voltage VC2. For example, if the second control voltage VC2 has a high logic level, the second switch element 170 may couple the second parallel inductive element 120 through the second discharge circuit 180 to the ground 199 (i.e., the second switch element 170 is similar to a short-circuited path). Conversely, if the second control voltage VC2 has a low logic level, the second switch element 170 may not couple the second parallel inductive element 120 through the second discharge circuit 180 to the ground 199 (i.e., the second switch element 170 is similar to an open-circuited path). According to practical measurement, such a design can significantly increase the whole discharging speed of the accelerating discharge device 100 when the external input power source is removed (or when the first input voltage VIN1 and the second input voltage VIN2 are both removed), thereby meeting the requirements the second edition of IEC 62368-1.

The following embodiments will introduce the detailed structure and operation of the accelerating discharge device 100. It should be understood these figures and descriptions are merely exemplary, rather than limitations of the invention.

Figure 2:
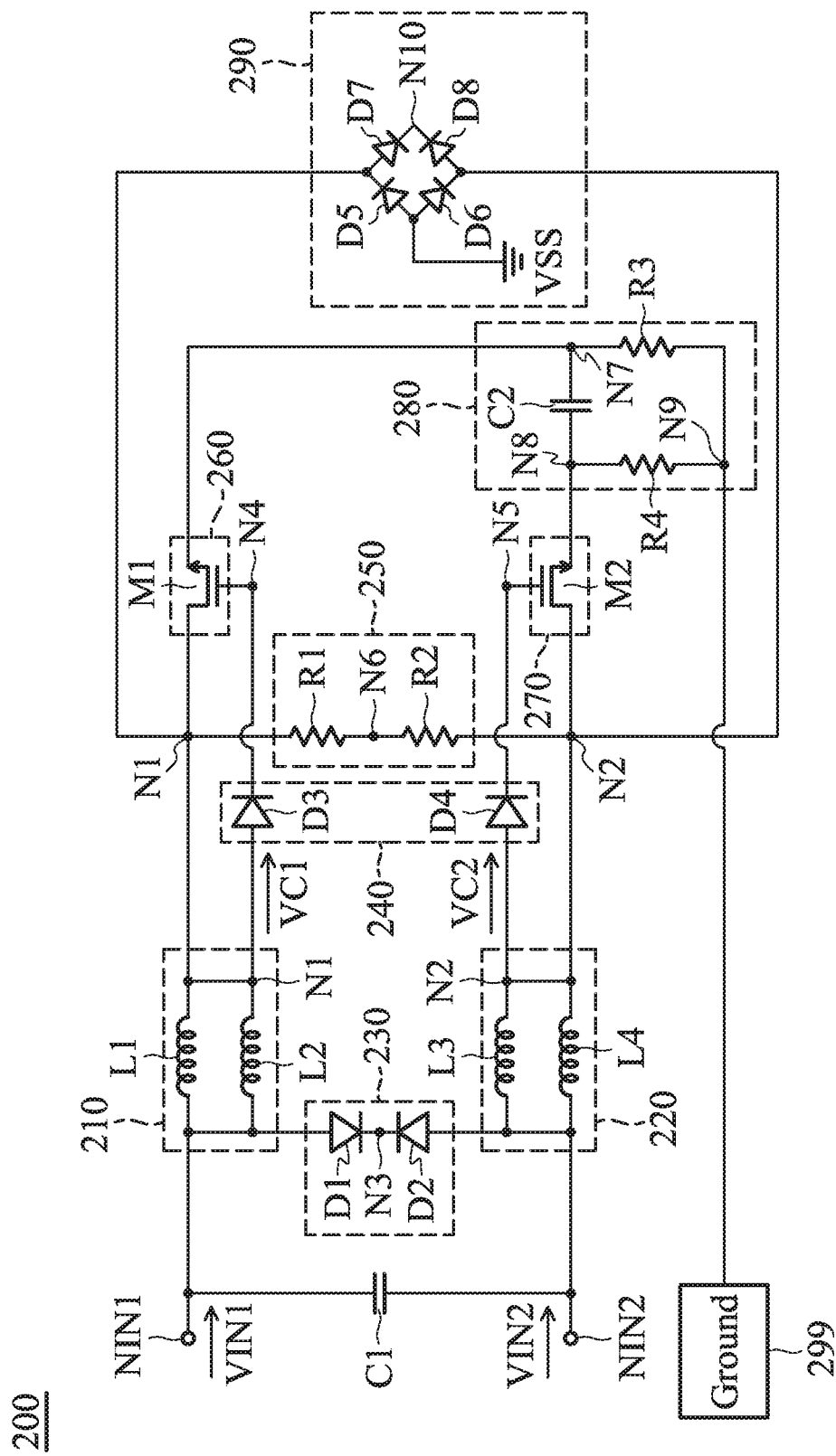
FIG. 2 is a diagram of an accelerating discharge device according to an embodiment of the invention.

FIG. 2 is a diagram of an accelerating discharge device 200 according to an embodiment of the invention. In the embodiment of FIG. 2, the accelerating discharge device 200 with a first input node NIN1 and a second input node NIN2 includes a first capacitor C1, a first parallel inductive element 210, a second parallel inductive element 220, a noise suppression element 230, a one-way element 240, a first discharge circuit 250, a first switch element 260, a second switch element 270, and a second discharge circuit 280. The first input node NIN1 and the second input node NIN2 of the accelerating discharge device 200 are arranged for receiving a first input voltage VIN1 and a second input voltage VIN2 from an external input power source, respectively. An AC voltage difference with any frequency and any magnitude may be formed between the first input voltage VIN1 and the second input voltage VIN2.

The first capacitor C1 has a first terminal coupled to the first input node NIN1, and a second terminal coupled to the second input node NIN2.

The first parallel inductive element 210 includes a first inductor L1 and a second inductor L2. The first inductor L1 has a first terminal coupled to the first input node NIN1, and a second terminal coupled to a first node N1 for outputting a first control voltage VC1. The second inductor L2 has a first terminal coupled to the first input node NIN1, and a second terminal coupled to the first node N1.

The second parallel inductive element 220 includes a third inductor L3 and a fourth inductor L4. The third inductor L3 has a first terminal coupled to the second input node NIN2, and a second terminal coupled to a second node N2 for outputting a second control voltage VC2. The fourth inductor L4 has a first terminal coupled to the second input node NIN2, and a second terminal coupled to the second node N2. In some embodiments, the third inductor L3 and the second inductor L2 are formed on the same iron core, and thus the third inductor L3 and the second inductor L2 are mutually coupled to each other.

The noise suppression element 230 includes a first diode D1 and a second diode D2. The first diode D1 has an anode coupled to the first input node NIN1, and a cathode coupled to a third node N3. The second diode D2 has an anode coupled to the second input node NIN2, and a cathode coupled to the third node N3. In some embodiments, the noise suppression element 230 is configured to prevent voltage/current noise from being transmitted between the first inductor L2 and the third inductor L3 even if they are formed on the same iron core.

The one-way element 240 includes a third diode D3 and a fourth diode D4. The third diode D3 has an anode coupled to the first node N1 for receiving the first control voltage VC1, and a cathode coupled to a fourth node N4. The fourth diode D4 has an anode coupled to the second node N2 for receiving the second control voltage VC2, and a cathode coupled to a fifth node N5. In some embodiments, the third diode D3 can limit the first control voltage VC1 transmitted only from the first node N1 to the fourth node N4, and the fourth diode D4 can limited the second control voltage VC2 transmitted only from the second node N2 to the fifth node N5. That is, the one-way element 240 can prevent the first control voltage VC1 and the second control voltage VC2 from accidentally flowing back to the first parallel inductive element 210 and the second parallel inductive element 220.

The first discharge circuit 250 includes a first resistor R1 and a second resistor R2. The first resistor R1 has a first terminal coupled to the first node N1, and a second terminal coupled to a sixth node N6. The second resistor R2 has a first terminal coupled to the second node N2, and a second terminal coupled to the sixth node N6.

The first switch element 260 includes a first transistor M1. The first transistor M1 may be an NMOS transistor (N-type Metal Oxide Semiconductor Field Effect Transistor). The first transistor M1 has a control terminal coupled to the fourth node N4 (for indirectly receiving the first control voltage VC1), a first terminal coupled to a seventh node N7, and a second terminal coupled to the first node N1. In some embodiments, if the first control voltage VC1 has a high logic level, the first transistor M1 will be enabled, and conversely, if the first control voltage VC1 has a low logic level, the first transistor M1 will be disabled.

The second switch element 270 includes a second transistor M2. The second transistor M2 may be an NMOS transistor. The second transistor M2 has a control terminal coupled to the fifth node N5 (for indirectly receiving the second control voltage VC2), a first terminal coupled to an eighth node N8, and a second terminal coupled to the second node N2. In some embodiments, if the second control voltage VC2 has a high logic level, the second transistor M2 will be enabled, and conversely, if the second control voltage VC2 has a low logic level, the second transistor M2 will be disabled.

The second discharge circuit 280 includes a second capacitor C2, a third resistor R3, and a fourth resistor R4. The second capacitor C2 has a first terminal coupled to the seventh node N7, and a second terminal coupled to the eighth node N8. The third resistor R3 has a first terminal coupled to the seventh node N7, and a second terminal coupled to a ninth node N9. The ninth node N9 may be further coupled to a ground 299. The ground 299 may mean the earth or any grounding path coupled to the earth, and it is not an internal element of the accelerating discharge device 200. The fourth resistor R4 has a first terminal coupled to the eighth node N8, and a second terminal coupled to the ninth node N9.

In some embodiments, the accelerating discharge device 200 further includes a bridge rectifier 290. The bridge rectifier 290 includes a fifth diode D5, a sixth diode D6, a seventh D7, and an eighth diode D8. The fifth diode D5 has an anode coupled to a ground voltage VSS (e.g., 0V), and a cathode coupled to the first node N1. The sixth diode D6 has an anode coupled to the ground voltage VSS, and a cathode coupled to the second node N2. The seventh diode D7 has an anode coupled to the first node N1, and a cathode coupled to a tenth node N10. The eighth diode D8 has an anode coupled to the second node N2, and a cathode coupled to the tenth node N10. It should be noted that the bridge rectifier 290 is merely an optional component, which is removable from the accelerating discharge device 200 in other embodiments. Furthermore, if the bridge rectifier 290 is omitted, the first node N1 and/or the second node N2 will be directly or indirectly coupled to the ground voltage VSS.

In some embodiments, the operation principles of the accelerating discharge device 200 are described as follows. In an initial mode, the accelerating discharge device 200 has not received the first input voltage VIN1 and the second input voltage VIN2, such that the first transistor M1 and the second transistor M2 are both disabled. In a normal operational mode, the accelerating discharge device 200 has received the first input voltage VIN1 and the second input voltage VIN2, and thus the first capacitor C1 starts to store energy. A respective current path is formed by each of the first parallel inductive element 210 and the second parallel inductive element 220. The first transistor M1 and the second transistor M2 are enabled alternately. Specifically, if the first input voltage VIN1 is positive (i.e., higher than the ground voltage VSS), a portion of the energy of the first capacitor C1 will be released through the first discharge circuit 250 to the ground voltage VSS, and another portion of the energy of the first capacitor C1 will be released through the enabled first transistor M1 and the second discharge circuit 280 to the ground 299. Conversely, if the second input voltage VIN2 is positive, a portion of the energy of the first capacitor C1 will be released through the first discharge circuit 250 to the ground voltage VSS, and another portion of the energy of the first capacitor C1 will be released through the enabled second transistor M2 and the second discharge circuit 280 to the ground 299. In a power failure test mode, the corresponding external input power source is removed (or the first input voltage VIN1 and the second input voltage VIN2 are both removed). At this time, the energy stored by the first capacitor C1 is still released through the aforementioned discharge paths. It should be noted that since the first parallel inductive element 210, the second parallel inductive element 220, the first discharge circuit 250, and the second discharge circuit 280 are used together, the whole discharging time of the accelerating discharge device 200 can be significantly reduced.

Figure 3:
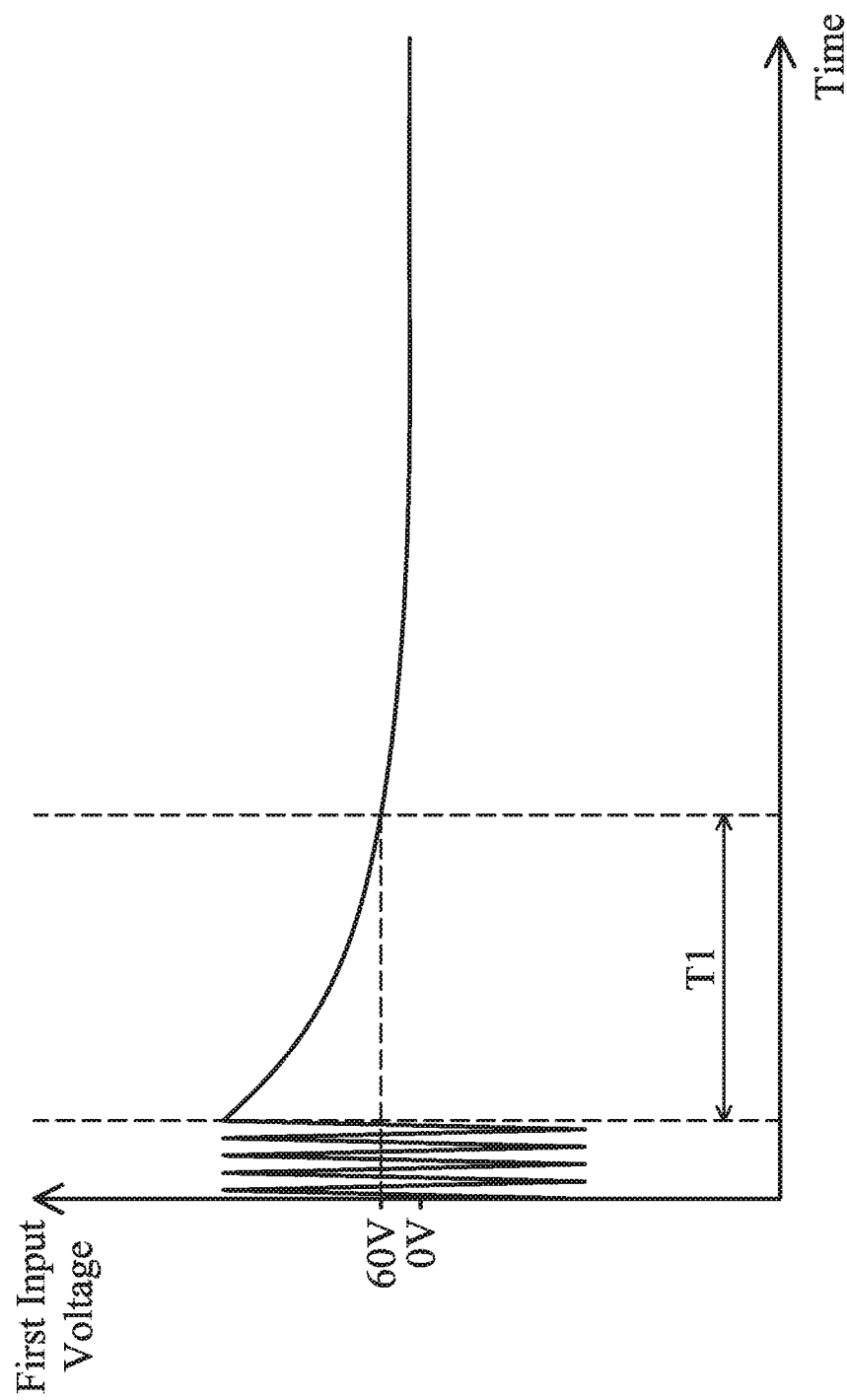
FIG. 3 is a diagram of a waveform of a first input voltage of an accelerating discharge device operating in a power failure test mode according to an embodiment of the invention.

FIG. 3 is a diagram of a waveform of the first input voltage VIN1 of the accelerating discharge device 200 operating in the power failure test mode according to an embodiment of the invention. Under normal conditions, if the external input power source is removed, the first input voltage VIN1 (or the second input voltage VIN2) will fall from a high voltage level (e.g., an AC voltage difference of 264V, or a DC voltage difference of 370V) down to 60V within a first charging time T1. The first charging time T1 may be about 1.315 seconds, which is shorter than 2 seconds prescribed by the second edition of IEC 62368-1.

Figure 4:
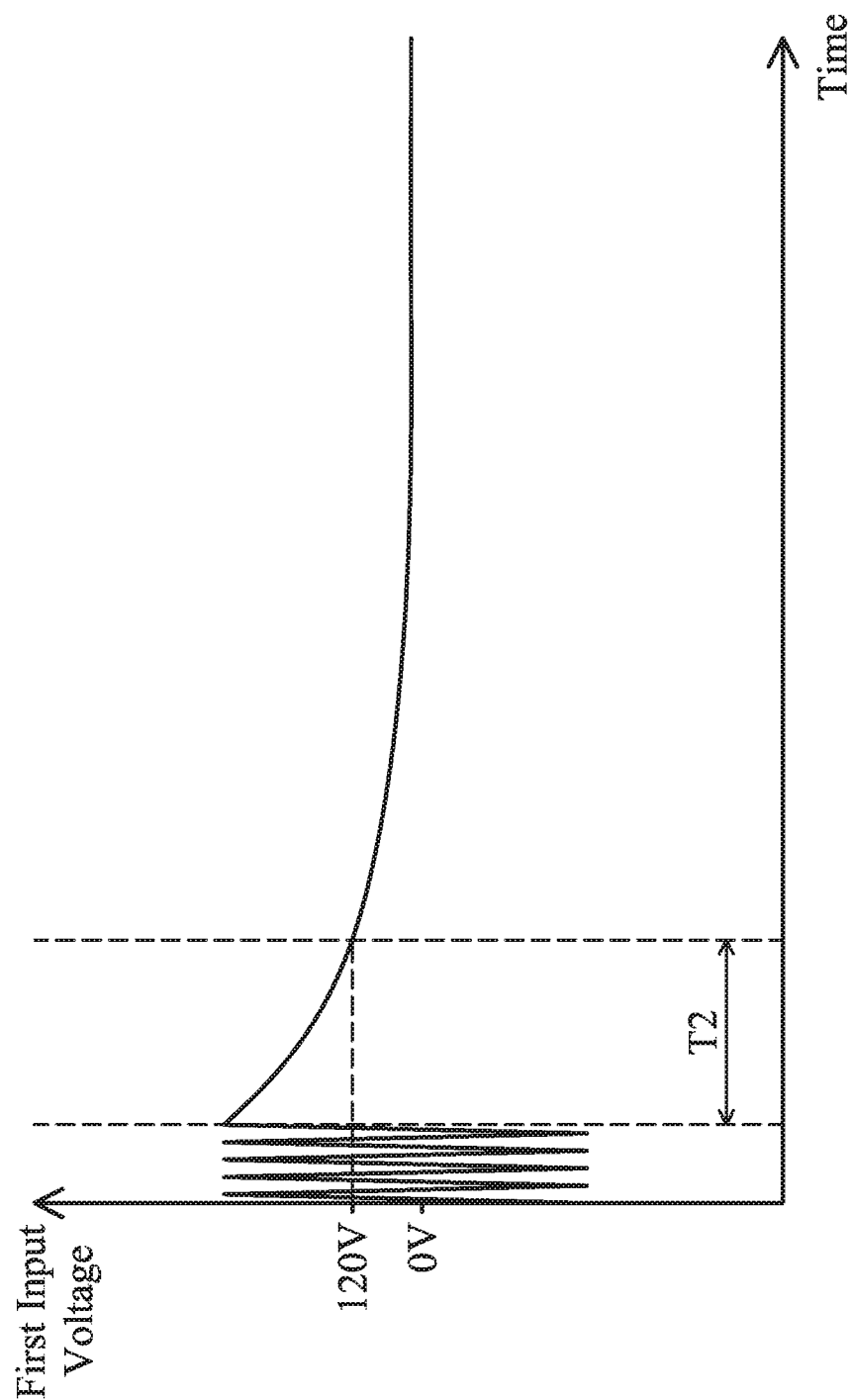
FIG. 4 is a diagram of a waveform of a first input voltage of an accelerating discharge device operating in a power failure test mode according to an embodiment of the invention.

FIG. 4 is a diagram of a waveform of the first input voltage VIN1 of the accelerating discharge device 200 operating in the power failure test mode according to an embodiment of the invention. Under abnormal conditions (i.e., any component of the accelerating discharge device 200 is replaced with an open-circuited path or a short-circuited path), if the external input power source is removed, the first input voltage VIN1 (or the second input voltage VIN2) will fall from a high voltage level (e.g., an AC voltage difference of 264V, or a DC voltage difference of 370V) down to 120V within a second charging time T2. The second charging time T2 may be about 0.79 seconds, which is also shorter than 2 seconds prescribed by the second edition of IEC 62368-1.

In some embodiments, the element parameters of the accelerating discharge device 200 are described as follows. The capacitance of the first capacitor C1 may be from 0.327 µF to 0.333 µF, such as 0.33 µF. The capacitance of the second capacitor C2 may be from 0.99 µF to 1.01 µF, such as 1 µg. The inductance of the first inductor L1 may be from 6.31 mH to 6.97 mH, such as 6.64 mH. The inductance of the second inductor L2 may be from 6.31 mH to 6.97 mH, such as 6.64 mH. The inductance of the third inductor L3 may be from 6.31 mH to 6.97 mH, such as 6.64 mH. The inductance of the fourth inductor L4 may be from 6.31 mH to 6.97 mH, such as 6.64 mH. The resistance of the first resistor R1 may be from 1.317 MΩ to 1.343 MΩ, such as 1.33 MΩ The resistance of the second resistor R2 may be from 1.317 MΩ to 1.343 MΩ, such as 1.33 MΩ The resistance of the third resistor R3 may be from 198 kΩ to 202 kΩ, such as 200 kΩ. The resistance of the fourth resistor R4 may be from 198 kΩ to 202 kΩ, such as 200 kΩ The above ranges of parameters are calculated and obtained according to the results of many experiments, and they help to minimize the whole discharging time of the accelerating discharge device 200.

The invention proposes a novel accelerating discharge device, which includes parallel inductive elements and two discharge circuits. According to practical measurements, the accelerating discharge device using the aforementioned design can significantly reduce its whole discharging time. The proposed design can meet the requirements of the second edition of IEC 62368-1, regardless of being under normal conditions or abnormal conditions, and it is suitable for application in a variety of electronic devices.

Note that the above voltages, currents, resistances, inductances, capacitances and other element parameters are not limitations of the invention. A designer can adjust these parameters according to different requirements. The accelerating discharge device of the invention is not limited to the configurations of FIGS. 1-4. The invention may merely include any one or more features of any one or more embodiments of FIGS. 1-4. In other words, not all of the features displayed in the figures should be implemented in the accelerating discharge device of the invention. Although the embodiments of the invention use MOSFET as examples, the invention is not limited thereto, and those skilled in the art may use other types of transistors, such as BJT (Bipolar Junction Transistor), JFET (Junction Gate Field Effect Transistor), FinFET (Fin Field Effect Transistor), etc., without affecting the performance of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made in the invention. It is intended that the standard and examples be considered exemplary only, with the true scope of the disclosed embodiments being indicated by the following claims and their equivalents.

What is claimed is:

1. An accelerating discharge device, comprising:
    a first parallel inductive element, generating a first control voltage according to a first input voltage;
    a second parallel inductive element, generating a second control voltage according to a second input voltage;
    a first capacitor, coupled between the first parallel inductive element and the second parallel inductive element;
    a noise suppression element, reducing interference between the first parallel inductive element and the second parallel inductive element;
    a one-way element, limiting the first control voltage and the second control voltage in a single transmission direction;
    a first discharge circuit, coupled between the first parallel inductive element and the second parallel inductive element;
    a second discharge circuit;
    a first switch element, selectively coupling the first parallel inductive element through the second discharge circuit to a ground according to the first control voltage; and
    a second switch element, selectively coupling the second parallel inductive element through the second discharge circuit to the ground according to the second control voltage.

2. The accelerating discharge device as claimed in claim 1, wherein the first parallel inductive element comprises:
    a first inductor, wherein the first inductor has a first terminal coupled to a first input node for receiving the first input voltage, and a second terminal coupled to a first node for outputting the first control voltage; and
    a second inductor, wherein the second inductor has a first terminal coupled to the first input node, and a second terminal coupled to the first node.

3. The accelerating discharge device as claimed in claim 2, wherein the second parallel inductive element comprises:
    a third inductor, wherein the third inductor has a first terminal coupled to a second input node for receiving the second input voltage, and a second terminal coupled to a second node for outputting the second control voltage; and
    a fourth inductor, wherein the fourth inductor has a first terminal coupled to the second input node, and a second terminal coupled to the second node;
    wherein the first capacitor has a first terminal coupled to the first input node, and a second terminal coupled to the second input node.

4. The accelerating discharge device as claimed in claim 3, wherein the noise suppression circuit comprises:
    a first diode, wherein the first diode has an anode coupled to the first input node, and a cathode coupled to a third node.

5. The accelerating discharge device as claimed in claim 4, wherein the noise suppression circuit further comprises:
    a second diode, wherein the second diode has an anode coupled to the second input node, and a cathode coupled to the third node.

6. The accelerating discharge device as claimed in claim 3, wherein the one-way element comprises:
    a third diode, wherein the third diode has an anode coupled to the first node for receiving the first control voltage, and a cathode coupled to a fourth node.

7. The accelerating discharge device as claimed in claim 6, wherein the one-way element further comprises:
    a fourth diode, wherein the fourth diode has an anode coupled to the second node for receiving the second control voltage, and a cathode coupled to a fifth node.

8. The accelerating discharge device as claimed in claim 3, wherein the first discharge circuit comprises:
    a first resistor, wherein the first resistor has a first terminal coupled to the first node, and a second terminal coupled to a sixth node.

9. The accelerating discharge device as claimed in claim 8, wherein the first discharge circuit further comprises:
    a second resistor, wherein the second resistor has a first terminal coupled to the second node, and a second terminal coupled to the sixth node.

10. The accelerating discharge device as claimed in claim 7, wherein the first switch element comprises:
    a first transistor, wherein the first transistor has a control terminal coupled to the fourth node, a first terminal coupled to a seventh node, and a second terminal coupled to the first node.

11. The accelerating discharge device as claimed in claim 10, wherein the second switch element comprises:
    a second transistor, wherein the second transistor has a control terminal coupled to the fifth node, a first terminal coupled to an eighth node, and a second terminal coupled to the second node.

12. The accelerating discharge device as claimed in claim 11, wherein the second discharge circuit comprises:
    a second capacitor, wherein the second capacitor has a first terminal coupled to the seventh node, and a second terminal coupled to the eighth node.

13. The accelerating discharge device as claimed in claim 12, wherein the second discharge circuit further comprises:
    a third resistor, wherein the third resistor has a first terminal coupled to the seventh node, and a second terminal coupled to a ninth node.

14. The accelerating discharge device as claimed in claim 13, wherein the second discharge circuit further comprises:
    a fourth resistor, wherein the fourth resistor has a first terminal coupled to the eighth node, and a second terminal coupled to the ninth node;
    wherein the ninth node is further coupled to the ground.

15. The accelerating discharge device as claimed in claim 3, further comprising a bridge rectifier which comprises:
    a fifth diode, wherein the fifth diode has an anode coupled to a ground voltage, and a cathode coupled to the first node;

a sixth diode, wherein the sixth diode has an anode coupled to the ground voltage, and a cathode coupled to the second node;
a seventh diode, wherein the seventh diode has an anode coupled to the first node, and a cathode coupled to a tenth node; and
an eighth diode, wherein the eighth diode has an anode coupled to the second node, and a cathode coupled to the tenth node.

* * * * *